(12) United States Patent
Dally

(10) Patent No.: US 8,841,953 B2
(45) Date of Patent: Sep. 23, 2014

(54) LOW CLOCK ENERGY DOUBLE-EDGE-TRIGGERED FLIP-FLOP CIRCUIT

(71) Applicant: NVIDIA Corporation, Santa Clara, CA (US)

(72) Inventor: William J. Dally, Los Altos Hills, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/775,063

(22) Filed: Feb. 22, 2013

(65) Prior Publication Data

US 2014/0240016 A1 Aug. 28, 2014

(51) Int. Cl.
*H03K 3/00* (2006.01)
*H03K 3/012* (2006.01)

(52) U.S. Cl.
CPC .................................. *H03K 3/012* (2013.01)
USPC ........................................................ 327/218

(58) Field of Classification Search
CPC ............................... H03K 3/037; H03K 3/012
USPC .................. 327/199–203, 205, 206, 208–219
See application file for complete search history.

(56) References Cited

U.S. PATENT DOCUMENTS

| 2007/0182473 | A1* | 8/2007 | Pacha et al. .................... 327/218 |
| 2012/0212271 | A1* | 8/2012 | Dally et al. .................... 327/199 |
| 2012/0274377 | A1 | 11/2012 | Alben et al. |

* cited by examiner

*Primary Examiner* — Sibin Chen
(74) *Attorney, Agent, or Firm* — Zilka-Kotab, PC

(57) ABSTRACT

A double-edge-triggered flip-flop circuit and a method for operating the double-edge-trigger flip-flop circuit are provided. Sub-circuits of a flip-flop circuit are coupled to a ground supply and decoupled the sub-circuits from a power supply when a clock signal is asserted. The sub-circuits generate trigger signals including a first pair of signals and a second pair of signals. The first pair of signals is evaluated, levels of the second pair of signals are maintained when the clock signal is asserted, and an output signal is transitioned to equal an input signal based on the trigger signals when the clock signal is asserted.

22 Claims, 12 Drawing Sheets

US 8,841,953 B2

LOW CLOCK ENERGY DOUBLE-EDGE-TRIGGERED FLIP-FLOP CIRCUIT

FIELD OF THE INVENTION

The present invention relates to circuits, and more specifically to flip-flop circuits.

BACKGROUND

Conventional devices such as microprocessors and graphics processors that are used in high-performance digital systems may have varying current demands based on the processing workload. Power dissipation is a significant problem in conventional integrated circuits. A large fraction of the power dissipated in conventional digital integrated circuits is consumed in the clock network. The amount of energy that is consumed by flip-flops due to data transitions is small because the activity factor, the fraction of time the data input of the flip-flop toggles, is quite low, typically about 5-10%. In contrast, the clock input load and clock energy is an increasingly important metric to consider when determining the energy that is consumed by the latches and flip-flops in a conventional integrated circuit. Reducing the clock-switched capacitance by a given amount produces 10× the power savings compared with reducing the data-switched capacitance by the same amount.

Thus, there is a need for reducing the clock input load of a circuit and/or addressing other issues associated with the prior art.

SUMMARY

A flip-flop circuit and a method for operating the flip-flop circuit are provided. The method of operating the flip-flop circuit comprises decoupling sub-circuits of the flip-flop circuit to a ground supply and decoupled the sub-circuits from a power supply when a clock signal is asserted. The sub-circuits generate trigger signals including a first pair of signals and a second pair of signals. The first pair of signals is evaluated, levels of the second pair of signals are maintained when the clock signal is asserted, and an output signal is transitioned to equal an input signal based on the trigger signals when the clock signal is asserted.

Another method of operating the flip-flop circuit comprises generating a first set signal when an input signal is high, an output signal is low, and a clock signal is negated, generating a second set signal when the input signal is high, the output signal is low, and the clock signal is asserted, generating a first reset signal when the input signal is low, the output signal is high, and the clock signal is negated, and generating a second reset signal when the input signal is low, the output signal is high, and the clock signal is asserted. The output signal of the flip-flop circuit is transitioned to equal the input signal when either the first set signal and the set signal are asserted or the first reset signal and the second reset signal are asserted.

The double-edge-triggered flip-flop circuit comprises a first trigger sub-circuit, a second trigger sub-circuit, and a latch sub-circuit. The first trigger sub-circuit is coupled to a first clock-enabled transistor that couples the first trigger sub-circuit to a power supply when a clock signal is negated and decouples the first trigger sub-circuit from the power supply when the clock signal is asserted. The second trigger sub-circuit is coupled to a second clock-enabled transistor that couples the second trigger sub-circuit to a ground supply when a clock signal is asserted and decouples the second trigger sub-circuit from the ground supply when the clock signal is negated. The first trigger sub-circuit generates a first trigger signal of trigger signals and the second trigger sub-circuit generates a second trigger signal of the trigger signals. The latch sub-circuit receives the trigger signals and transitions an output to equal an input based on the trigger signals.

Another double-edge-triggered flip-flop circuit comprises a latch sub-circuit, a first trigger sub-circuit, a second trigger sub-circuit, a third trigger sub-circuit, and a fourth trigger sub-circuit. The latch sub-circuit is configured to receive trigger signals including a first set signal, a second set signal, a first reset signal, and a second reset signal and transition an output to equal an input based on the trigger signals. The first trigger sub-circuit generates the first set signal when the input is high, the output is low, and a clock signal is negated. The second trigger sub-circuit generates the second set signal when the input is high, the output is low, and the clock signal is asserted. The third trigger sub-circuit generates the first reset signal when the input is low, the output is high, and the clock signal is negated. The fourth trigger sub-circuit generates the second reset signal when the input is low, the output is high, and the clock signal is asserted.

DETAILED DESCRIPTION

Reducing the number of loads on a clock signal provided as an input to a flip-flop circuit reduces the energy consumed by the clock signal. The flip-flop circuit may be configured as a double-edge triggered flip-flop that updates an output Q with the state of an input D on both edges of the clock signal. The power consumed by the double-edge triggered flip-flop circuit is reduced because internal nodes do not toggle when the input D is stable. Compared with a conventional single-edge triggered flip-flop circuit that typically presents 12 loads (i.e., transistor gates) to the clock signal, the double-edge triggered flip-flop circuit presents four loads to the clock signal. Because the double-edge triggered flip-flop operates at twice the frequency of a conventional single-edge triggered flip-flop circuit, the double-edge triggered flip-flop provides a factor of 6 reduction in clock energy compared with a conventional single-edge triggered flip-flop circuit presenting 12 loads to the clock signal. In one embodiment, in which keeper transistors are omitted, the double-edge triggered flip-flop circuit presents only two loads to the clock signal, further reducing the clock energy compared with a single-edge triggered flip-flop circuit.

Figure 1A:
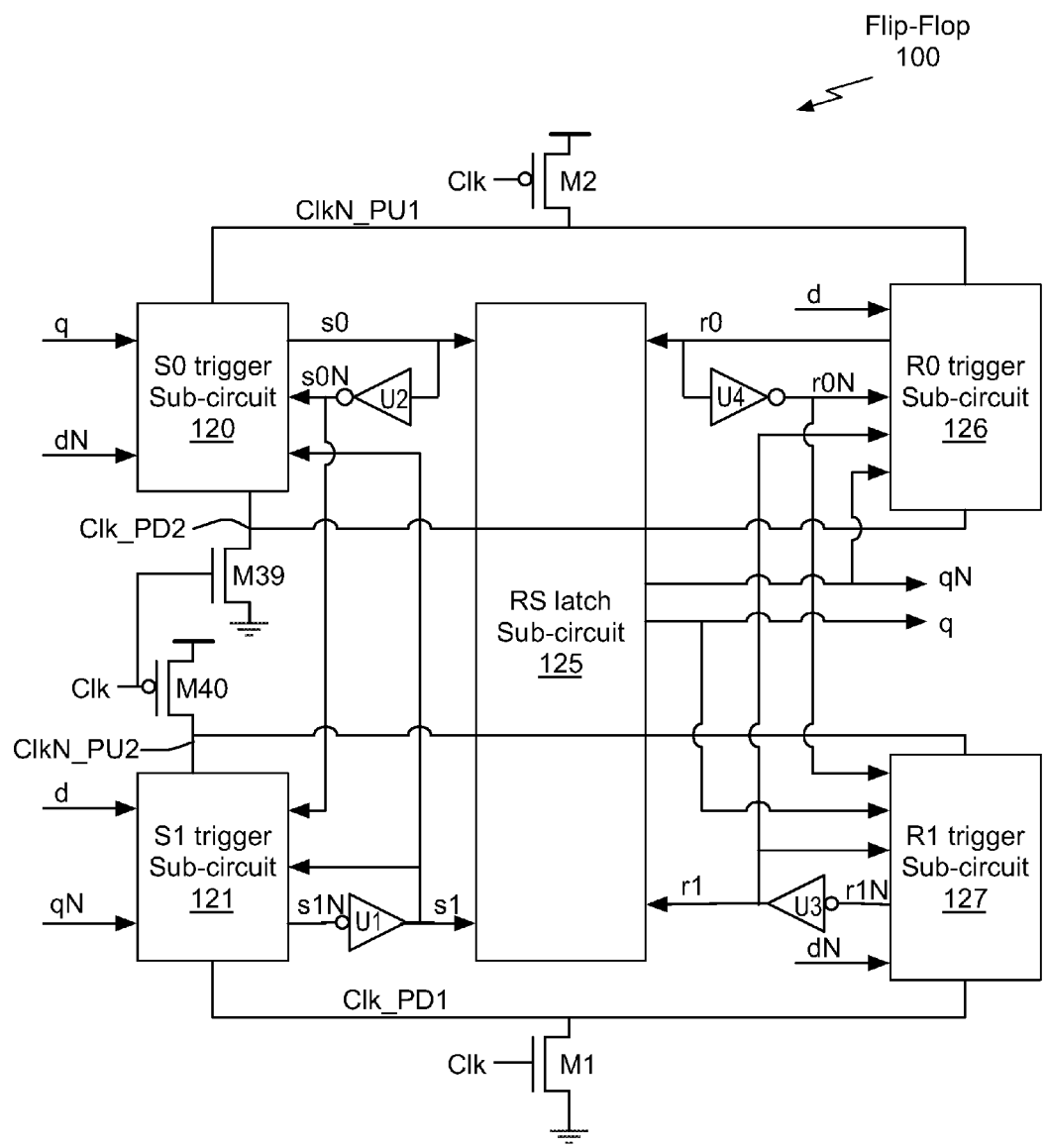
FIG. 1A illustrates a double-edge-triggered flip-flop circuit, in accordance with one embodiment.

FIG. 1A illustrates a double-edge-triggered flip-flop circuit 100, in accordance with one embodiment. The flip-flop circuit 100 includes a RS latch sub-circuit 125 and four trigger sub-circuits: an S0 trigger sub-circuit 120, an S1 trigger sub-circuit 121, a R0 trigger sub-circuit 126, and a R1 trigger sub-circuit 127. The flip-flop circuit 100 also includes two clock-enabled transistors M1 and M2. The clock enabled transistor M1 is shared by the S1 trigger sub-circuit 121 and the R1 trigger sub-circuit 127. The clock-enabled transistor M2 is shared by the S0 trigger sub-circuit 120 and the R0 trigger sub-circuit 126.

When the input d is an opposite level compared with the output q, the output q is set to equal the level of d on the next transition of the clock. Input dN is an inverted version of the input d and qN is an inverted version of the output q. The RS latch sub-circuit 125 receives trigger signals s0, s1, r0, and r1 as inputs and stores the outputs q and qN. The RS latch sub-circuit 125 pulls q high (and qN low) when both set trigger signals, s0 and s1, are asserted. The RS latch sub-circuit 125 pulls q low (and qN high) when both reset trigger signals, r0 and r1, are asserted. When at least one of s0 and s1 is negated and at least one of r0 and r1 is negated, the RS latch sub-circuit 125 holds q. The RS latch sub-circuit 125 may transition q and qN following a rising edge of the clock signal (clk) and/or following a falling edge of clk based on the trigger signals s0, s1, r0, and r1.

The S0 trigger sub-circuit 120 is configured to assert the trigger signal s0 when q=0, dN=0, and clk=0. The S1 trigger sub-circuit 121 is configured to assert the trigger signal s1 when d=1, qN=1, and clk=1. When input d rises while q is low, one of the two set trigger signals will initially transition high. If d is held high until the next edge of the clk, rising or falling, the other set trigger will transition high setting the q output of the RS latch sub-circuit 125. Once either s0 or s1 is asserted, the asserted signal remains asserted, as long as d does not change state, until after the next transition of the clock signal so that both s0 and s1 will be asserted to set q. The inverters U1 and U2 generate s1 and s0N by inverting s1N and s0, respectively.

When q=0 at a falling edge of the clk and the input d is high during the clk transition (meeting setup and hold time constraints), the s1 trigger signal is asserted when the clk is high and the s0 trigger signal is asserted when the clk transitions low, causing q to be pulled high. The transition of q from low to high and qN from high to low, following the falling edge of the clk, clears (i.e., negates or deasserts) both set trigger signals. Operation is similar on the rising edge of the clk, but with the order of assertion for the two set trigger signals reversed. Specifically, if d rises while clk=0, the set trigger signal s0 is asserted by the S0 trigger sub-circuit 120. When the clk transitions, the S1 trigger sub-circuit 121 transitions the set trigger signal s1 from low to high, and the RS latch sub-circuit 125 pulls up the output q and pulls down the output qN. As soon as the outputs q and qN transition, both set trigger signals s0 and s1 are cleared.

The R0 trigger sub-circuit 126 is configured to assert the trigger signal r0 when qN=0, d=0, and clk=0. The R1 trigger sub-circuit 127 is configured to assert the trigger signal r1 when dN=1, q=1, and clk=1. When input d falls while q is high, one of the two reset trigger signals will initially transition high. If d is held low until the next edge of the clk, rising or falling, the other reset trigger will transition high resetting the q output of the RS latch sub-circuit 125. Once either r0 or r1 is asserted, the asserted signal remains asserted, unless d changes state, until after the next transition of the clock signal so that both r0 and r1 will be asserted to reset q.

When q=1 at a falling edge of the clk and the input d is low during the clk transition (meeting setup and hold time constraints), the r1 trigger signal is asserted when the clk is high and the r0 trigger signal is asserted when the clk transitions low, causing q to be pulled low. The transition of q from high to low and qN from low to high following the falling edge of the clk, clears (i.e., negates or deasserts) both reset trigger signals. Operation is similar on the rising edge of the clk, but with the order of assertion for the two reset trigger signals reversed. Specifically, If d falls while clk=0, the reset trigger signal r0 is asserted by the R0 trigger sub-circuit 126. When the clk transitions, the R1 trigger sub-circuit 127 transitions the reset trigger signal r1 from low to high, and the RS latch sub-circuit 125 pulls down the output q and pulls up the output qN. As soon as the outputs q and qN transition, both reset trigger signals r0 and r1 are cleared.

In one embodiment (as shown in FIG. 1A), the flip-flop circuit 100 includes two additional clock-enabled transistors M39 and M40. The clock-enabled transistor M39 is shared by the S0 trigger sub-circuit 120 and the R0 trigger sub-circuit 126. The clock-enabled transistor M40 is shared by the S1 trigger sub-circuit 121 and the R1 trigger sub-circuit 127. The clock-enabled transistor M39 is coupled to keeper circuits within the S0 trigger sub-circuit 120 and the R0 trigger sub-circuit 126. The clock-enabled transistor M40 is coupled to keeper circuits within the S1 trigger sub-circuit 121 and the R1 trigger sub-circuit 127. If s1 rises when clk=1 and s0 is low, the keeper circuit within the S0 trigger sub-circuit 120 keeps s0 low (i.e., prevents s0 from being asserted) until the clk falls and the clock-enabled transistor M39 is disabled. Similarly, if s0 rises when clk=0 and s1 is low, the keeper circuit within the S1 trigger sub-circuit 121 keeps s1 low until the clk rises and the clock-enabled transistor M40 is disabled. If r1 rises when clk=1 and r0 is low, the keeper circuit within the R0 trigger sub-circuit 126 keeps r0 low until the clk falls and the clock-enabled transistor M39 is disabled. Similarly, if r0 rises when clk=0 and s1 is low, the keeper circuit within the R1 trigger sub-circuit 127 keeps r1 low until the clk rises and the clock-enabled transistor M40 is disabled. The clock-enabled transistor M39 can be shared between the S0 trigger sub-circuit 120 and the R0 trigger sub-circuit 126 because s0 and r0 cannot be asserted simultaneously. The clock-enabled transistor M40 can be shared between the S1 trigger sub-circuit 121 and the R1 trigger sub-circuit 127 because s1 and r1 cannot be asserted simultaneously.

In another embodiment, the clock-enabled transistors M39 and M40 are omitted (replaced with open circuits) because the fabrication process has low leakage characteristics and the time during which the clock is low is short enough that the node s1N and the node r1N will not inadvertently transition low. Similarly, the time during which the clock is high should be short enough that the node s0 and the node r0 will not inadvertently transition high.

In yet another embodiment, the clock-enabled transistors M39 and M40 are replaced with high-valued resistors or with low valued current sources to provide enough current to overcome leakage on the nodes s1N, r1N, s0, and/or r0 while also presenting a small load, so that transistors are able to pull the nodes s1N, r1N, s0, and/or r0 down or up when needed. For example, the clock-enabled transistors M39 and M40 may be replaced with a current mirror that is configured to bias the gate of a transistor that replaced the transistor M39 so that the gate-biased transistor functions as a low valued current source. When configured as a low valued current source, the clock-enabled transistor M39 only draws the current needed to restore leakage on the node s0 and/or r0. When the node s0 is pulled high, the clock-enabled transistor M39 will weakly fight the pull-up transistors within the S0 trigger sub-circuit 120 until the node s0N (output of the inverter U2) goes low.

Figure 1B:
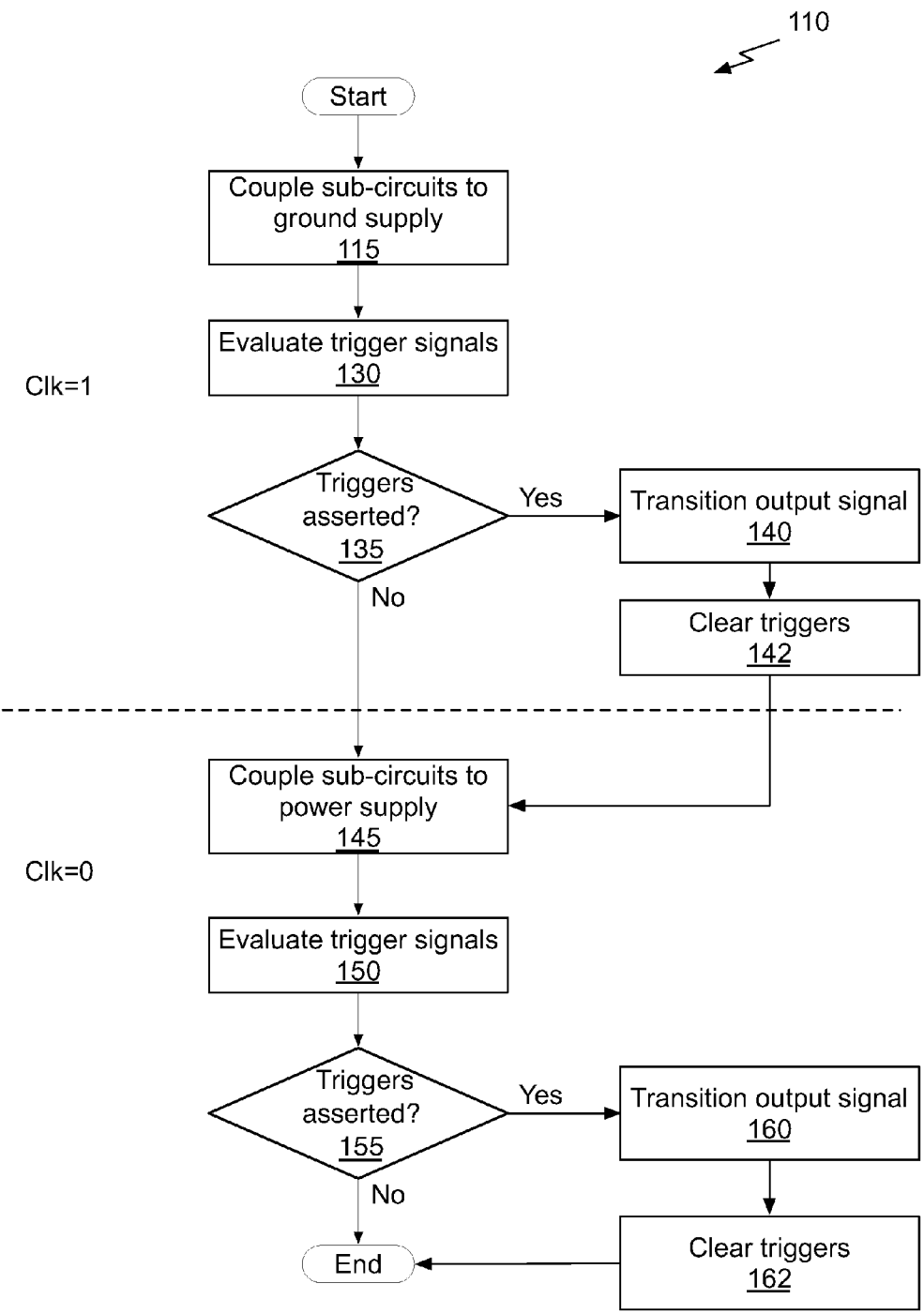
FIG. 1B illustrates a flowchart of a method for operating the double-edge-triggered flip-flop circuit of FIG. 1A, in accordance with one embodiment.

FIG. 1B illustrates a flowchart 110 of a method for operating the double-edge-triggered flip-flop circuit 100 of FIG. 1A, in accordance with one embodiment. At step 115, the S1 trigger sub-circuit 121 and the R1 trigger sub-circuit 127 are coupled to the ground supply through the clock-enabled transistor M1 when the clk is asserted. The S0 trigger sub-circuit 120 and the R0 trigger sub-circuit 126 are decoupled from the power supply by the clock-enabled transistor M2 when the clk is asserted. At step 130, s1 and r1 are evaluated by the S1 trigger sub-circuit 121 and the R1 trigger sub-circuit 127. The levels of r0 and s0 are maintained when clk is asserted and d and q are at opposite levels. At step 135, if the set trigger signals s0 and s1 are asserted or if the reset trigger signals r0 and r1 are asserted, then at step 140 the output signal q is transitioned (from high to low when both reset trigger signals are asserted or from low to high when both set trigger signals are asserted). Otherwise, the method proceeds directly to step 145. At step 142, the trigger signals that were asserted at step 135 are cleared.

At step 145, the S0 trigger sub-circuit 120 and the R0 trigger sub-circuit 126 are coupled to the power supply through the clock-enabled transistor M2 when the clk is negated. The S1 trigger sub-circuit 121 and the R1 trigger sub-circuit 127 are decoupled from the ground supply by the clock-enabled transistor M1 when the clk is negated. At step 150, s0 and r0 are evaluated by the S0 trigger sub-circuit 120 and the R0 trigger sub-circuit 126. The levels of r1 and s1 are maintained when clk is negated and d and q are at opposite levels. At step 155, if the set trigger signals s0 and s1 are asserted or if the reset trigger signals r0 and r1 are asserted, then at step 160 the output signal q is transitioned (from high to low or from low to high). Otherwise, the method terminates. At step 162, the trigger signals that were asserted at step 155 are cleared and the method terminates. The method may repeat for one or more cycles of the clk.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

As used herein, the transistors are coupled directly to a signal if the signal is coupled to the transistor without any intervening logic, and the transistors are coupled indirectly to a signal if the signal is coupled to the transistor with intervening logic. Intervening logic may be any type of discrete logic. For example, a transistor may be connected to a ground or supply voltage indirectly through additional circuit elements that comprise a current source.

Figure 2A:
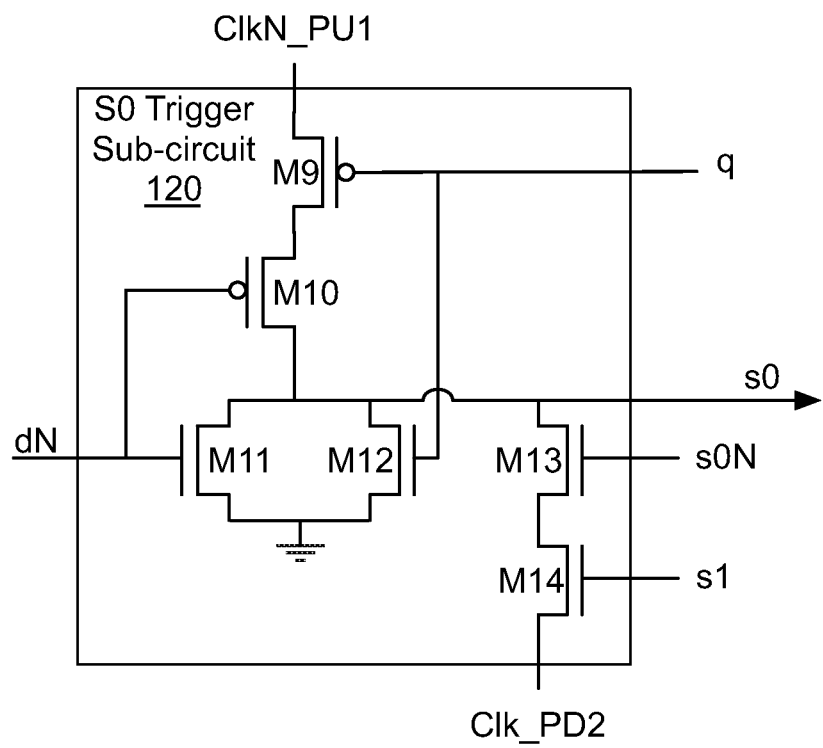
FIG. 2A illustrates the S0 sub-circuit shown in FIG. 1A, in accordance with one embodiment.

FIG. 2A illustrates the S0 trigger sub-circuit 120 shown in FIG. 1A, in accordance with one embodiment. The S0 trigger sub-circuit 120 includes two P-type metal-oxide semiconductor (PMOS) transistors M9 and M10 that are configured as pull-up devices coupled to ClkN_PU1 (generated by the clock-enabled transistor M2). When clk=0, dN=0, and q=0 the transistors M9, M10, and M2 pull s0 high. The S0 trigger sub-circuit 120 includes two N-type metal-oxide semiconductor (NMOS) transistors M11 and M12 that pull s0 low when either dN=1 or q=1. The NMOS transistors M13 and M14 are configured as a down keeper circuit that is coupled to Clk_PD2 (generated by the clock-enabled transistor M39) that keeps s0 low when s1=1, clk=1, and s0=0.

The down keeper may be included in the S0 trigger sub-circuit 120 because the state where d=1, q=0, and s0=0 can persist for the entire time when clk=1. When the fabrication process does not have low leakage characteristics, or the period of clk is long, the node s0 could leak high while clk=1 causing s0 to transition high inadvertently—setting the RS latch sub-circuit 125 prematurely. In one embodiment, when the fabrication process has low leakage characteristics or the period of clk is short enough that leakage will not cause s0 to transition inadvertently, the transistors M13 and M14 (and the clock-enabled transistor M39) may be omitted, reducing the load on the clock signal.

The transistor M14 is needed to allow the clock-enabled transistor M39 to be shared between the S0 trigger sub-circuit 120 and the R0 trigger sub-circuit 126. If the transistor M14 is omitted and the source of the clock-enabled transistor M39 is tied directly to the transistor M13, pulling up s0 will also partially pull up r0, possibly leading to erroneous operation. Because s1 and r1 are not simultaneously asserted, the transistor M14 will not be enabled at the same time as the corresponding transistor (M38) in the down keeper circuit of the R0 trigger sub-circuit 126. Therefore, the clock-enabled transistor M39 can be shared between the S0 trigger sub-circuit 120 and the R0 trigger sub-circuit 126.

An up keeper circuit is not needed to hold the set trigger signal s0 high when d=1, q=0, clk=1, and s0N=0 because this is a very short transient state. The state is entered when the clk rises, at which point the set trigger signal s1 transitions high setting the RS latch sub-circuit 125, causing q to rise which in turn drives s0 low. However, the S0 trigger sub-circuit 120 may be implemented as a fully static circuit by adding an up keeper circuit. The up keeper comprises two PMOS transistors in series from s0 to the drain of the clock-enabled transistor M2 with gates driven by the set trigger signals s1N and s0N. However, because the transient state only persists for two gate delays (10-20 ps in a typical 28 nm process) the up keeper circuit should not be needed.

Figure 2B:
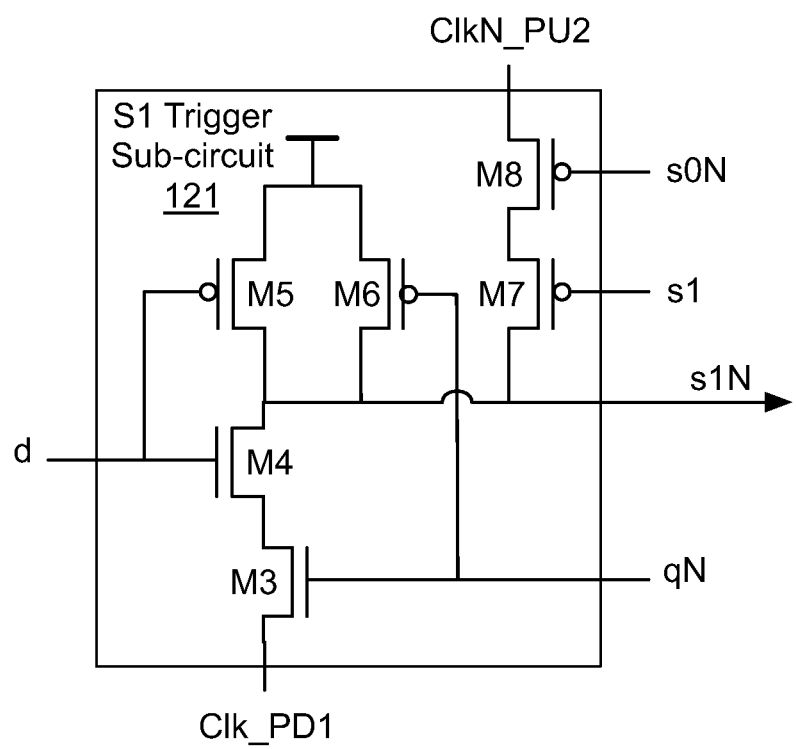
FIG. 2B illustrates the S1 sub-circuit shown in FIG. 1A, in accordance with one embodiment.

FIG. 2B illustrates the S1 sub-circuit 121 shown in FIG. 1A, in accordance with one embodiment. The S1 trigger sub-circuit 120 includes two NMOS transistors M3 and M4 that are configured as pull-down devices coupled to Clk_PD1 (generated by the clock-enabled transistor M1). When clk=1, d=1, and qN=1 the transistors M3, M4, and M1 pull s1N low. The S1 trigger sub-circuit 121 includes two PMOS transistors M5 and M6 that pull s1N high when either d=0 or qN=0. The PMOS transistors M7 and M8 are configured as a up keeper circuit that is coupled to ClkN_PU2 (generated by the clock-enabled transistor M40) that keeps s1N high when s0N=0, clk=0, and s1=0.

The up keeper may be included in the S0 trigger sub-circuit 120 because the state where d=1, q=0, and s1=0 can persist for the entire time when clk=0. When the fabrication process does not have low leakage characteristics, or the period of clk is long, the node s1N could leak low while clk=0 causing s1 to transition high inadvertently—setting the RS latch sub-circuit 125 prematurely. In one embodiment, when the fabrication process has low leakage characteristics or the period of clk is short enough that leakage will not cause s1 to transition inadvertently, the transistors M7 and M8 (and the clock-enabled transistor M40) may be omitted, reducing the load on the clock signal.

The transistor M8 is needed to allow the clock-enabled transistor M40 to be shared between the S1 trigger sub-circuit 121 and the R1 trigger sub-circuit 127. If the transistor M8 is omitted and the drain of the clock-enabled transistor M40 is tied directly to the transistor M7, pulling down s1N will also partially pull down r1N, possibly leading to erroneous operation. Because s1 and r1 are not simultaneously asserted, the transistor M8 will not be enabled at the same time as the corresponding transistor (M32) in the up keeper circuit of the R1 trigger sub-circuit 127. Therefore, the clock-enabled transistor M40 can be shared between the S1 trigger sub-circuit 121 and the R1 trigger sub-circuit 127.

A down keeper circuit is not needed to hold the set trigger signal s1N low when d=1, q=0, clk=0, and s1=1 because this is a very short transient state. The state is entered when the clk falls, at which point the set trigger signal s0 transitions high setting the RS latch sub-circuit 125, causing q to rise which in turn drives s1 low. However, the S1 trigger sub-circuit 121 may be implemented as a fully static circuit by adding a down keeper circuit. The down keeper comprises two NMOS transistors in series from s1N to the drain of the clock-enabled transistor M1 with gates driven by the set trigger signals s1 and s0. As previously explained, because the transient state only persists for two gate delays the down keeper circuit should not be needed.

Figure 2C:
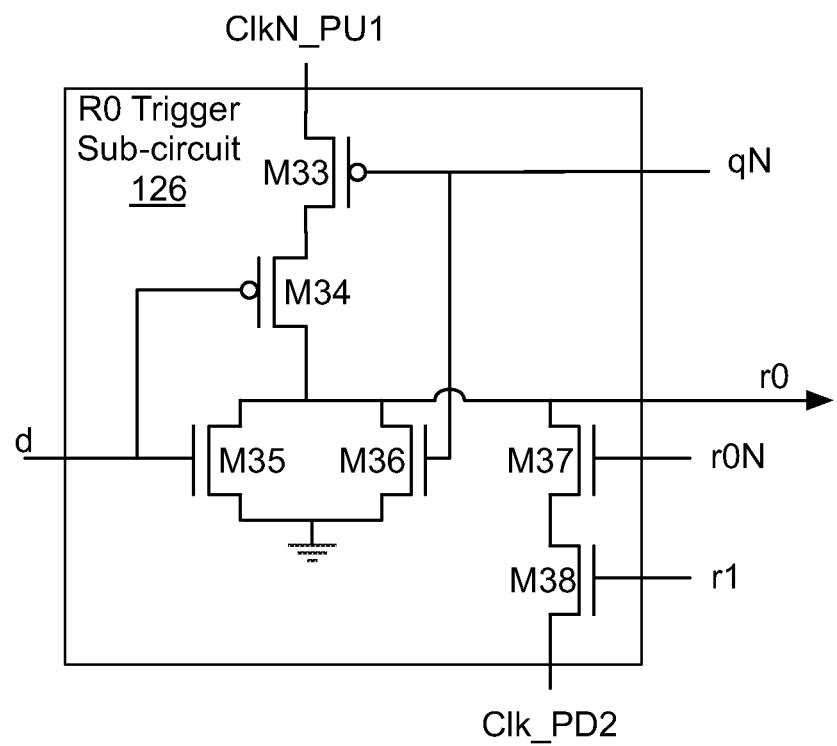
FIG. 2C illustrates the R0 sub-circuit shown in FIG. 1A, in accordance with one embodiment.

FIG. 2C illustrates the R0 trigger sub-circuit 126 shown in FIG. 1A, in accordance with one embodiment. The R0 trigger sub-circuit 126 has the same topology as the S0 trigger sub-circuit 120 and includes two PMOS transistors M33 and M34 that are configured as pull-up devices coupled to ClkN_PU1 (generated by the clock-enabled transistor M2). When clk=0, qN=0, and d=0 the transistors M33, M34, and M2 pull r0 high. The R0 trigger sub-circuit 126 includes two NMOS transistors M35 and M36 that pull r0 low when either qN=1 or d=1. The NMOS transistors M37 and M38 are configured as a down keeper circuit that is coupled to Clk_PD2 (generated by the clock-enabled transistor M39) that keeps r0 low when r1=1, clk=1, and r0=0.

The down keeper may be included in the R0 trigger sub-circuit 126 because the state where q=1, d=0, and r0=0 can persist for the entire time when clk=1. When the fabrication process does not have low leakage characteristics, or the period of clk is long, the node r0 could leak high while clk=1 causing r0 to transition high inadvertently—resetting the RS latch sub-circuit 125 prematurely. In one embodiment, when the fabrication process has low leakage characteristics or the period of clk is short enough that leakage will not cause r0 to transition inadvertently, the transistors M37 and M38 (and the clock-enabled transistor M39) may be omitted, reducing the load on the clock signal.

The transistor M38 is needed to allow the clock-enabled transistor M39 to be shared between the R0 trigger sub-circuit 126 and the S0 trigger sub-circuit 120. If the transistor M38 is omitted and the source of the clock-enabled transistor M39 is tied directly to the transistor M37, pulling up r0 will also partially pull up s0, possibly leading to erroneous operation. Because s1 and r1 are not simultaneously asserted, the transistor M38 will not be enabled at the same time as the corresponding transistor (M14) in the down keeper circuit of the S0 trigger sub-circuit 120. Therefore, the clock-enabled transistor M39 can be shared between the S0 trigger sub-circuit 120 and the R0 trigger sub-circuit 126.

An up keeper circuit is not needed to hold the reset trigger signal r0 high when q=1, d=0, clk=1, and r0N=0 because this is a very short transient state. The state is entered when the clk rises, at which point the reset trigger signal r1 transitions high, resetting the RS latch sub-circuit 125, causing q to fall which in turn drives r0 low. However, the R0 trigger sub-circuit 126 may be implemented as a fully static circuit by adding an up keeper circuit. The up keeper comprises two PMOS transistors in series from r0 to the drain of the clock-enabled transistor M2 with gates driven by the reset trigger signals r1N and r0N. As previously explained, because the transient state only persists for two gate delays the up keeper circuit should not be needed.

Figure 2D:
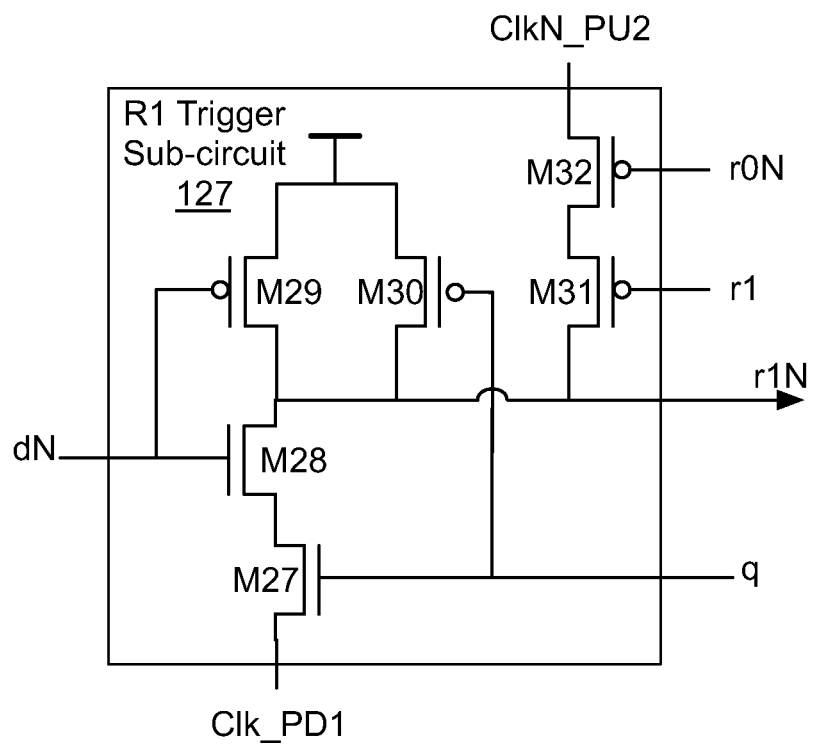
FIG. 2D illustrates the R1 sub-circuit shown in FIG. 1A, in accordance with one embodiment.

FIG. 2D illustrates the R1 trigger sub-circuit 127 shown in FIG. 1A, in accordance with one embodiment. The R1 trigger sub-circuit 127 has the same topology as the S1 trigger sub-circuit 121 and includes two NMOS transistors M27 and M28 that are configured as pull-down devices coupled to Clk_PD1 (generated by the clock-enabled transistor M1). When clk=1, q=1, and dN=1 the transistors M27, M28, and M1 pull r1N low. The R1 trigger sub-circuit 127 includes two PMOS transistors M29 and M30 that pull r1N high when either q=0 or dN=0. The PMOS transistors M31 and M32 are configured as an up keeper circuit that is coupled to ClkN_PU2 (generated by the clock-enabled transistor M40) that keeps r1N high when r0N=0, clk=0, and r1=0.

The up keeper may be included in the R0 trigger sub-circuit 127 because the state where q=1, d=0, and r1=0 can persist for the entire time when clk=0. When the fabrication process does not have low leakage characteristics, or the period of clk is long, the node r1N could leak low while clk=0 causing r1 to transition high inadvertently—resetting the RS latch sub-circuit 125 prematurely. In one embodiment, when the fabrication process has low leakage characteristics or the period of clk is short enough that leakage will not cause r1 to transition inadvertently, the transistors M31 and M32 (and the clock-enabled transistor M40) may be omitted, reducing the load on the clock signal.

The transistor M32 is needed to allow the clock-enabled transistor M40 to be shared between the S1 trigger sub-circuit 121 and the R1 trigger sub-circuit 127. If the transistor M32 is omitted and the drain of the clock-enabled transistor M40 is tied directly to the transistor M31, pulling down r1N will also partially pull down s1N, possibly leading to erroneous operation. Because s1 and r1 are not simultaneously asserted, the transistor M32 will not be enabled at the same time as the corresponding transistor (M8) in the up keeper circuit of the S1 trigger sub-circuit 121. Therefore, the clock-enabled transistor M40 can be shared between the S1 trigger sub-circuit 121 and the R1 trigger sub-circuit 127.

A down keeper circuit is not needed to hold the set trigger signal rN1 low when q=1, d=0, clk=0, and r1=1 because this is a very short transient state. The state is entered when the clk falls, at which point the reset trigger signal r0 transitions high resetting the RS latch sub-circuit 125, causing q to fall which in turn drives r1 low. However, the R1 trigger sub-circuit 127 may be implemented as a fully static circuit by adding a down keeper circuit. The down keeper comprises two NMOS transistors in series from r1N to the drain of the clock-enabled transistor M1 with gates driven by the reset trigger signals r1 and r0. As previously explained, because the transient state only persists for two gate delays the down keeper circuit should not be needed.

The order of the pull-up transistors in the S0 trigger sub-circuit 120 and the R0 trigger sub-circuit 126 may be reversed compared with the order shown in FIGS. 2A and 2C. The order of the pull-down transistors in the S1 trigger sub-circuit 121 and the R1 trigger sub-circuit 127 may be reversed compared with the order shown in FIGS. 2B and 2D. For example, as shown in FIG. 2A, the transistor driven by q (M9) is nearest to the shared clock-enabled transistor M2 and the transistor driven by dN (M10) is nearest to the output s0. The order of the signals q and dN relative to the transistor M2, as shown in FIG. 2A minimizes the toggling of internal nodes because the signal q toggles less frequently compared with the signal dN. In other words, it is possible for dN to transition one or more times without generating a transition on q. Additionally, placing dN closer to the output s0 provides a slightly faster response to a change of the input d (i.e., the setup time is reduced). However, the function performed by the S0 trigger sub-circuit 120 is the same even if the order of the transistors M9 and M10 is reversed compared with what is shown in FIG. 2A. Similarly, the order of the pull-up transistors M33 and M34 may be reversed in a different embodiment of the R0 trigger sub-circuit 126, the order of the pull-down transistors M3 and M4 may be reversed in a different embodiment of the S1 trigger sub-circuit 121 and the order of the pull-down transistors M27 and M28 may be reversed in a different embodiment of the R1 trigger sub-circuit 127. Additionally, the order of the down keeper transistors M13 and M14 may be reversed in a different embodiment of the S0 trigger sub-circuit 120. The order of the up keeper transistors M7 and M8 may be reversed in a different embodiment of the S1 trigger sub-circuit 121. The order of the down keeper transistors M37 and M38 may be reversed in a different embodiment of the R0 trigger sub-circuit 126. The order of the up keeper transistors M31 and M32 may be reversed in a different embodiment of the R1 trigger sub-circuit 127.

Figure 3:
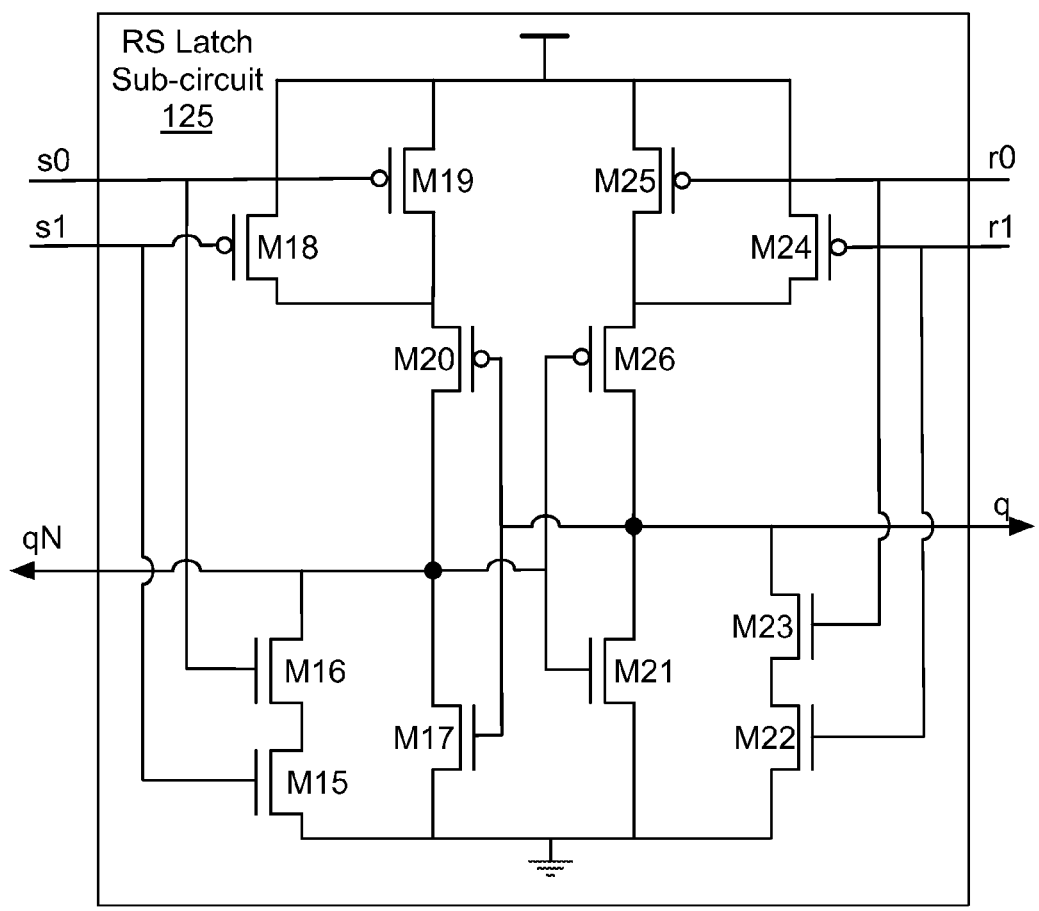
FIG. 3 illustrates the RS sub-circuit shown in FIG. 1A, in accordance with one embodiment.

FIG. 3 illustrates the RS latch sub-circuit 125 shown in FIG. 1A, in accordance with one embodiment. The RS latch sub-circuit 125 receives the trigger signals s0, s1, r0, and r1 and generates the output signals q and qN. The RS latch sub-circuit 125 includes a cross-coupled inverter circuit comprising the transistors M17, M20, M21, and M26 that store the level of the output signals q and qN. The pull-up transistors M18 and M19 are configured to couple the cross-coupled inverter circuit to the power supply to pull qN high when at least one of s0 or s1 is negated. The pull-up transistors M24 and M25 are configured to couple the cross-coupled inverter circuit to the power supply to pull q high when at least one of r0 or r1 is negated. The pull down transistors M15 and M16 are configured to pull qN low when both s0 and s1 are asserted. The pull down transistors M22 and M23 are configured to pull q low when both r0 and r1 are asserted.

Figure 4A:
FIG. 4A illustrates a state table for the S0 sub-circuit shown in FIG. 2A, in accordance with one embodiment.

FIG. 4A illustrates a state table 400 for the S0 trigger sub-circuit 120 shown in FIG. 2A, in accordance with one embodiment. The S0 trigger sub-circuit 120 is a sequential circuit having operation that depends on the state of the clk. The output signal s0 is set high when d=1, q=0, and clk=0 and is reset low if d=0 or q=1. The output s0 holds the previous state (s0) if d=1, q=0, and clk=1.

Figure 4B:
FIG. 4B illustrates a state table for the S1 sub-circuit shown in FIG. 2B, in accordance with one embodiment.

FIG. 4B illustrates a state table 410 for the S1 trigger sub-circuit 121 shown in FIG. 2B, in accordance with one embodiment. The S1 trigger sub-circuit 121 is a sequential circuit. The output s1 is set high when d=1, q=0, and clk=1 and is reset low if d=0 or q=1. The output s1 holds the previous state (s1) if d=1, q=0, and clk=0.

Figure 4C:
FIG. 4C illustrates a state table for the R0 sub-circuit shown in FIG. 2C, in accordance with one embodiment.

FIG. 4C illustrates a state table 420 for the R0 trigger sub-circuit 126 shown in FIG. 2C, in accordance with one embodiment. The R0 trigger sub-circuit 126 is a sequential circuit. The output signal r0 is set high when d=0, q=1, and clk=0 and is reset low if d=1 or q=0. The output r0 holds the previous state (r0) if d=0, q=1, and clk=1.

Figure 4D:
FIG. 4D illustrates a state table for the R1 sub-circuit shown in FIG. 2D, in accordance with one embodiment.

FIG. 4D illustrates a state table 430 for the R1 trigger sub-circuit 127 shown in FIG. 2D, in accordance with one embodiment. The R1 trigger sub-circuit 127 is a sequential circuit. The output signal r1 is set high when d=0, q=1, and clk=1 and is reset low if d=1 or q=0. The output r1 holds the previous state (r1) if d=0, q=1, and clk=0.

Figure 4E:
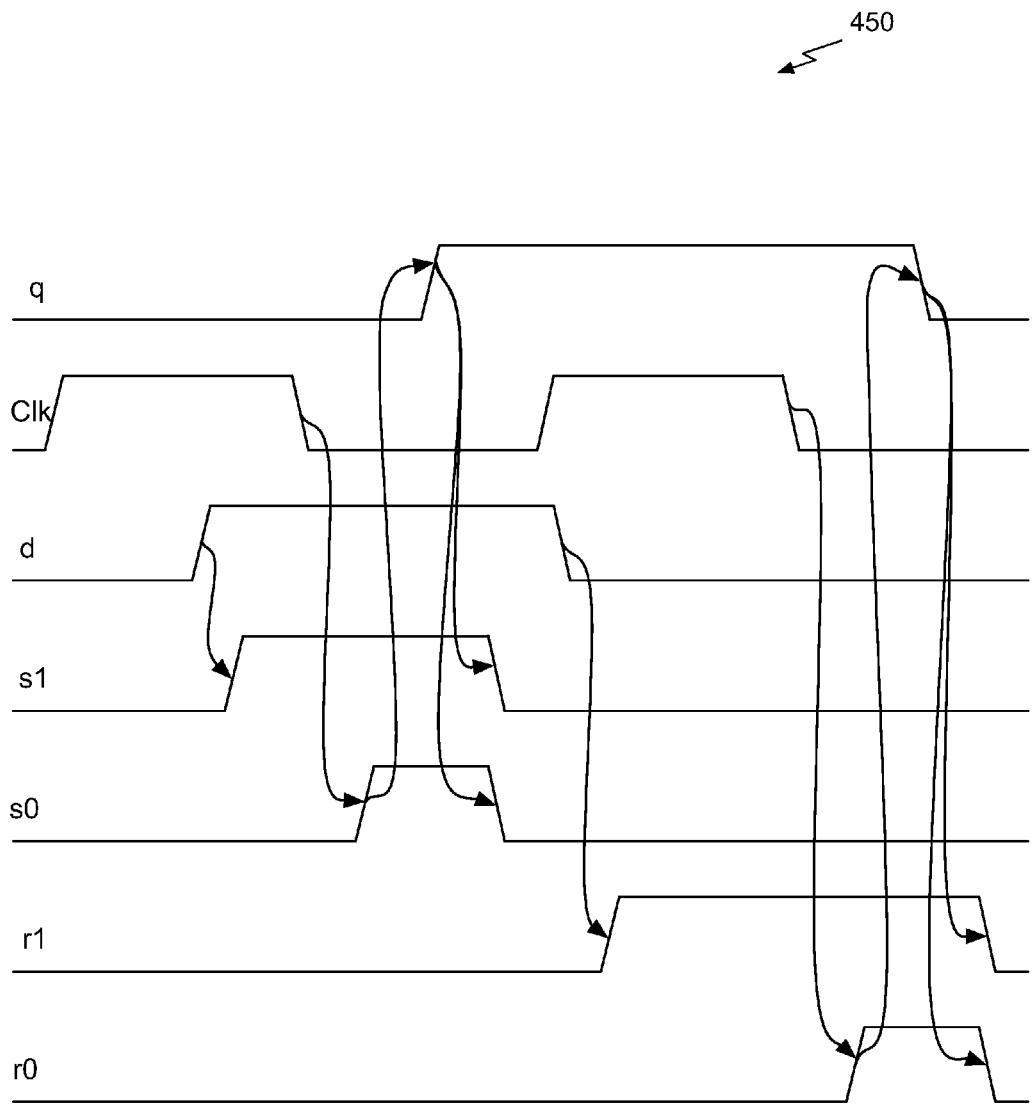
FIG. 4E illustrates a timing diagram for the double-edge-triggered flip-flop circuit shown in FIG. 1A, in accordance with one embodiment.

FIG. 4E illustrates a timing diagram 450 for the double-edge-triggered flip-flop circuit 100 shown in FIG. 1A, in accordance with one embodiment. The flip-flop circuit 100 begins following a reset, so the q output is low. The arrows in FIG. 4E indicate causality. The sequence begins when input d rises while the clk is high, causing the set trigger signal s1 to rise because d=1, q=0, and clk=1. The set trigger signal s0 is held low by the keeper circuit comprising the transistors M13 and M14 and shared clock-enabled transistor M39 while d=1, q=0, and clk=1.

When the clk falls, d=1, q=0, and clk=0 and the transistors M2, M9, and M10 pull the set trigger signal s0 high. The keeper circuit releases the pull-down on the set trigger signal s0 when the shared clock-enabled transistor M39 turns off. When the set trigger signals s0 and s1 are both asserted, the RS latch sub-circuit 125 is set generating q=1, qN=0. In response to the transition of q and qN, the set trigger signals s0 and s1 are cleared by the transistors M6 and M12, respectively.

The clk rises again and the input d falls while the clk is high, causing the reset trigger signal r1 to rise because d=0, q=1, and clk=1. The reset trigger signal r0 is held low by the keeper circuit comprising the transistors M37 and M38 and shared clock-enabled transistor M39 while d=0, q=1, and clk=1.

When the clk falls, d=0, q=1, and clk=0 and the transistors M2, M33, and M34 pull the reset trigger signal r0 high. The keeper circuit releases the pull-down on the reset trigger signal r0 when the shared clock-enabled transistor M39 turns off. When the reset trigger signals r0 and r1 are both asserted, the RS latch sub-circuit 125 is reset generating q=0, qN=1. In response to the transition of q and qN, the reset trigger signals r0 and r1 are cleared by the transistors M36 and M30, respectively.

Figure 5:
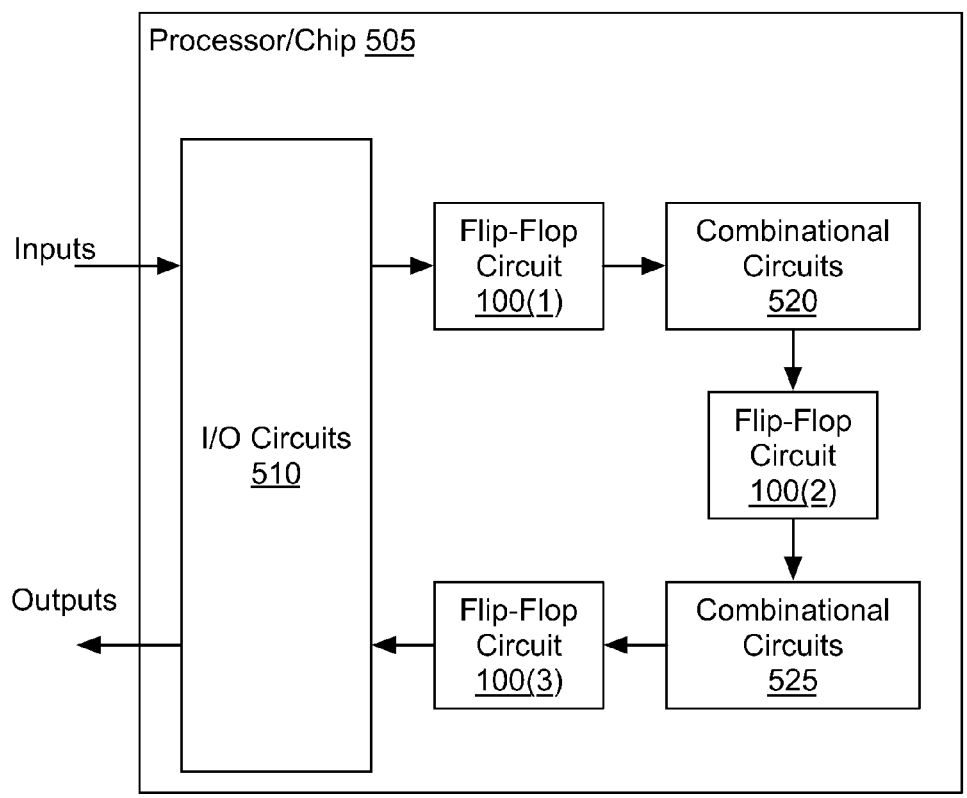
FIG. 5 is a block diagram illustrating a processor/chip including the flip-flop circuit shown in FIG. 1A, in accordance with accordance with one embodiment.

FIG. 5 is a block diagram illustrating a processor/chip 505 including the flip-flop circuit 100 from FIG. 1A, in accordance with one or more aspects of the present invention. I/O circuits 510 may include pads and other I/O specific circuits to send and receive signals from other devices in a system. Outputs are produced by I/O circuits 510 based on signals received by the I/O circuits 510. The inputs received by the I/O circuits 510 are input to the first flip-flop circuit 100(1) for storage. The I/O circuits 510 also provide clock signals to the flip-flop circuits 100. The combinational circuits 520 receive the output generated by the first flip-flop circuit 100(1) and generate a combinational output that is received by the second flip-flop circuit 100(2). The second flip-flop circuit 100(2) stores the combinational output and generates an output that is input to the combinational circuits 525. The output of the combinational circuits 525 is received and stored by the third flip-flop circuit 100(3). The third flip-flop circuit 100(3) generates an output that is provided to the I/O circuits 510. The flip-flop circuits 100 may be used to store signals for multiple clock cycles or to pipeline signals that change as frequently as each clock cycle.

Figure 6:
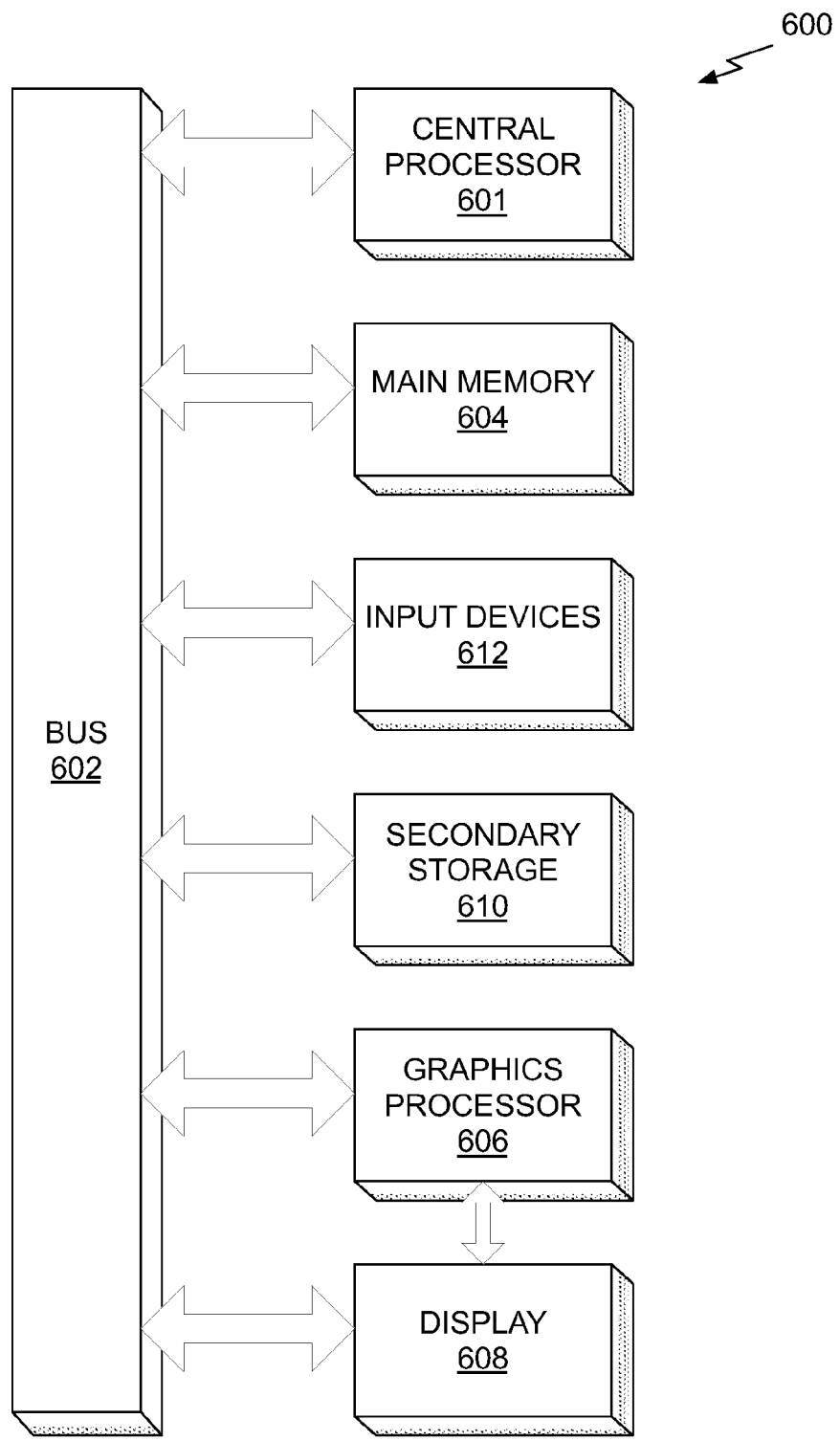
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 608, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user. The flip-flop circuit 100 may be incorporated into one or more of the central processor 601, main memory 604, secondary storage 610, input devices 612, graphics processor 606, display 608, and bus 602.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 604 and/or the secondary storage 610. Such computer programs, when executed, enable the system 600 to perform various functions. The main memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   coupling sub-circuits of a flip-flop circuit to a ground supply and decoupling the sub-circuits from a power supply when a clock signal is asserted, wherein the sub-circuits are configured to generate trigger signals including a first pair of signals and a second pair of signals;
   evaluating the first pair of signals generated by the sub-circuits when the clock signal is asserted;
   maintaining levels of the second pair of signals when the clock signal is asserted;
   transitioning an output signal to equal an input signal based on the trigger signals when the clock signal is asserted; and
   transitioning the output signal to equal the input signal based on the trigger signals when the clock signal is negated.

2. The method of claim 1, wherein the first pair of signals comprises a first reset signal and a first set signal and the second pair of signals comprises a second reset signal and a second set signal.

3. The method of claim 2, wherein the output signal is pulled low when the first reset signal and the second reset signal are asserted.

4. The method of claim 2, wherein the output signal is pulled high when the first set signal and the second set signal are asserted.

5. The method of claim 2, wherein the first reset signal and the second reset signal are cleared when the output signal is pulled low.

6. The method of claim 2, wherein the first set signal and the second set signal are cleared when the output signal is pulled high.

7. The method of claim 2, wherein when the first set signal is asserted, a keeper circuit is configured to prevent the second set signal from being asserted until the clock signal transitions.

8. The method of claim 1, further comprising:
   coupling the sub-circuits to the power supply and decoupling the sub-circuits from the ground supply when the clock signal is negated; and
   evaluating the second pair of signals generated by the sub-circuits when the clock signal is negated.

9. A method, comprising:
   generating a first set signal when an input signal is high, an output signal is low, and a clock signal is negated;
   generating a second set signal when the input signal is high, the output signal is low, and the clock signal is asserted;
   generating a first reset signal when the input signal is low, the output signal is high, and the clock signal is negated;
   generating a second reset signal when the input signal is low, the output signal is high, and the clock signal is asserted; and
   transitioning the output signal of a flip-flop circuit to equal the input signal when either the first set signal and the second set signal are asserted or the first reset signal and the second reset signal are asserted.

10. The method of claim 9, further comprising coupling sub-circuits of the flip-flop circuit to a ground supply and decoupling the sub-circuits from a power supply when the clock signal is asserted, wherein the sub-circuits are configured to generate the first set signal, the first reset signal, the second set signal, and the second reset signal.

11. The method of claim 9, further comprising decoupling sub-circuits of the flip-flop circuit from a ground supply and coupling the sub-circuits to a power supply when the clock signal is negated, wherein the sub-circuits are configured to generate the first set signal, the first reset signal, the second set signal, and the second reset signal.

12. The method of claim 9, wherein the output signal of the flip-flop circuit transitions based on the first set signal, the second set signal, the first reset signal, and the second reset signal in response to a falling edge of the clock and in response to a rising edge of the clock.

13. A double-edge-triggered flip-flop circuit, comprising:
a first trigger sub-circuit that is coupled to a first clock-enabled transistor that couples the first trigger sub-circuit to a power supply when a clock signal is negated and decouples the first trigger sub-circuit from the power supply when the clock signal is asserted, wherein the first trigger sub-circuit generates a first trigger signal of a set of trigger signals, transitioning the first trigger signal high when the input signal and the output signal are at opposite levels and the clock signal is low;
a second trigger sub-circuit that is coupled to a second clock-enabled transistor that couples the second trigger sub-circuit to a ground supply when the clock signal is asserted and decouples the second trigger sub-circuit from the ground supply when the clock signal is negated, wherein the second trigger sub-circuit generates a second trigger signal of the set of trigger signals, transitioning the second trigger signal high when the input signal and the output signal are at opposite levels and the clock signal is high; and
a latch sub-circuit configured to receive the set of trigger signals and transition an output signal to equal an input signal, when the first trigger signal and the second trigger signal are asserted, when the clock signal is low and when the clock signal is high.

14. The double-edge-triggered flip-flop circuit of claim 13, wherein the first trigger sub-circuit is configured to clear the first trigger signal and the second trigger sub-circuit is configured to clear the second trigger signal when the output signal transitions to equal the input signal.

15. The double-edge-triggered flip-flop circuit of claim 13, further comprising a keeper circuit that, when the first trigger signal is asserted, is configured to prevent the second trigger signal from being asserted until the clock signal transitions.

16. The double-edge-triggered flip-flop circuit of claim 13, further comprising:
a third clock-enabled transistor that couples the first trigger sub-circuit to the ground supply when the clock signal is asserted and decouples the first trigger sub-circuit from the ground supply when the clock signal is negated; and
a fourth clock-enabled transistor that couples the second trigger sub-circuit to the power supply when the clock signal is negated and decouples the second trigger sub-circuit from the power supply when the clock signal is asserted.

17. The double-edge-triggered flip-flop circuit of claim 13, further comprising a device that is coupled to the first trigger sub-circuit and configured to provide current to overcome leakage at a storage node in the latch sub-circuit.

18. The double-edge-triggered flip-flop circuit of claim 13, further comprising a device that is coupled to the second trigger sub-circuit and configured to provide current to overcome leakage at a storage node in the latch sub-circuit.

19. The double-edge-triggered flip-flop circuit of claim 13, further comprising:
a third trigger sub-circuit that is coupled to the first clock-enabled transistor and generates a third trigger signal of the set of trigger signals; and
a fourth trigger sub-circuit that is coupled to the second clock-enabled transistor and generates a fourth trigger signal of the set of trigger signals.

20. A double-edge-triggered flip-flop circuit, comprising:
a latch sub-circuit configured to receive a set of trigger signals and transition an output signal to equal an input signal based on the set of trigger signals, wherein the set of trigger signals includes a first set signal, a second set signal, a first reset signal, and a second reset signal;
a first trigger sub-circuit that generates the first set signal when the input signal is high, the output signal is low, and a clock signal is negated;
a second trigger sub-circuit that generates the second set signal when the input signal is high, the output signal is low, and the clock signal is asserted;
a third trigger sub-circuit that generates the first reset signal when the input signal is low, the output signal is high, and the clock signal is negated; and
a fourth trigger sub-circuit that generates the second reset signal when the input signal is low, the output signal is high, and the clock signal is asserted.

21. The double-edge-triggered flip-flop circuit of claim 20, further comprising:
a first clock-activated transistor that is coupled to the first trigger sub-circuit and the third trigger sub-circuit and configured to couple the first trigger sub-circuit and the third trigger sub-circuit to the power supply when the clock signal is negated and decouples the first trigger sub-circuit and the third trigger sub-circuit from the power supply when the clock signal is asserted; and
a second clock-enabled transistor that is coupled to the second trigger sub-circuit and the fourth trigger sub-circuit and configured to couple the second trigger sub-circuit and the fourth trigger sub-circuit to the ground supply when the clock signal is asserted and decouples the second trigger sub-circuit and the fourth trigger sub-circuit from the ground supply when the clock signal is negated.

22. The double-edge-triggered flip-flop circuit of claim 20, wherein the latch sub-circuit is further configured to transition the output signal based on the first set signal, the second set signal, the first reset signal, and the second reset signal in response to a falling edge of the clock and in response to a rising edge of the clock.

* * * * *